US012805104B2

(12) United States Patent
Toko et al.

(10) Patent No.: US 12,805,104 B2
(45) Date of Patent: Nov. 17, 2026

(54) MANUFACTURING METHOD OF ORGANIC TRANSISTOR, ORGANIC TRANSISTOR DEVICE, AND LIQUID CRYSTAL DISPLAY ELEMENT

(71) Applicant: STANLEY ELECTRIC CO., LTD., Tokyo (JP)

(72) Inventors: Yasuo Toko, Tokyo (JP); Megumi Ota, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 335 days.

(21) Appl. No.: 18/666,943

(22) Filed: May 17, 2024

(65) Prior Publication Data

US 2024/0389367 A1 Nov. 21, 2024

(30) Foreign Application Priority Data

May 19, 2023 (JP) ................................ 2023-083278

(51) Int. Cl.

*H10K 10/46* (2023.01)
*G02F 1/1337* (2006.01)
*G02F 1/137* (2006.01)

(52) U.S. Cl.

CPC ......... *H10K 10/481* (2023.02); *G02F 1/1337* (2013.01); *G02F 1/13712* (2021.01)

(58) Field of Classification Search

CPC .. H10K 10/481; H10K 10/484; H10K 10/466; H10K 71/191; G02F 1/13712; G02F 1/1337

USPC ........................................ 257/40; 438/82, 99

See application file for complete search history.

(56) References Cited

U.S. PATENT DOCUMENTS

2005/0046771 A1* 3/2005 Lee ....................... G02F 1/1362 349/126
2005/0247978 A1* 11/2005 Weng ..................... H10K 71/60 438/149
2006/0079032 A1* 4/2006 Denda ................. H10D 30/031 438/149
2007/0040169 A1* 2/2007 Kim ....................... H10K 71/13 257/40

(Continued)

FOREIGN PATENT DOCUMENTS

JP 2020154174 A 9/2020

*Primary Examiner* — Didarul A Mazumder
(74) *Attorney, Agent, or Firm* — Holtz, Holtz & Volek PC

(57) ABSTRACT

To achieve higher definition of a channel portion of an organic transistor and to reduce bulging at the edge part of the channel portion. A manufacturing method of an organic transistor includes: forming a gate electrode on a substrate surface; forming a gate insulating film on the substrate surface to cover the gate electrode; forming a drain electrode and a source electrode with a predetermined distance therebetween on the gate insulating film surface and at a position where each electrode partially overlaps with the gate electrode; forming a liquid crystal alignment film on the gate insulating film surface to cover the drain electrode and the source electrode; forming an opening part by dripping an etchant to a region of the liquid crystal alignment film that overlaps with the gate electrode in a plane view; and forming an organic semiconductor film at the opening part of the liquid crystal alignment film.

12 Claims, 8 Drawing Sheets

(56) References Cited

U.S. PATENT DOCUMENTS

| | | | | |
|---|---|---|---|---|
| 2011/0297920 | A1* | 12/2011 | Fukuda | H10K 10/471<br>257/E51.024 |
| 2012/0292622 | A1* | 11/2012 | Liu | H10K 59/123<br>174/257 |
| 2020/0064198 | A1* | 2/2020 | Bremensdorfer | B23K 26/032 |

* cited by examiner

MANUFACTURING METHOD OF ORGANIC TRANSISTOR, ORGANIC TRANSISTOR DEVICE, AND LIQUID CRYSTAL DISPLAY ELEMENT

BACKGROUND

Technical Field

The present disclosure relates to a manufacturing method of an organic transistor, an organic transistor, and a liquid crystal element.

Description of the Background Art

Japanese Unexamined Patent Application Publication No. 2020-154174 discloses a liquid crystal display element in which an organic semiconductor layer can be formed by inkjet printing. Specifically, the liquid crystal display element includes: a gate electrode disposed on a main substrate; a gate insulating film disposed to cover the gate electrode; a source electrode and a drain electrode disposed on the gate insulating film; a main electrode connected to the drain electrode; a liquid crystal alignment layer having an opening part in a portion corresponding to a part of the source electrode, a part of the drain electrode and the gate electrode; an organic semiconductor layer disposed to connect within the opening part of the liquid crystal alignment layer and to connect to the part of the source electrode and the part of the drain electrode; a counter substrate disposed opposing to the main substrate and having a counter electrode opposing to the main electrode; and a liquid crystal layer disposed between the substrates and in contact with the liquid crystal alignment layer. And the gate electrode, the gate insulating film, the source electrode, the drain electrode and the organic semiconductor layer constitute an organic transistor.

However there is still room for improvement in that it is difficult to further reduce the size of the organic semiconductor layer that constitutes a channel portion of the organic transistor, and that defective alignment of the liquid crystal layer may occur due to the bulging edge part of the channel portion.

In a specific aspect, it is an object of the present disclosure to achieve higher definition of a channel portion of an organic transistor and to reduce bulging at the edge part of the channel portion.

SUMMARY (1) A manufacturing method of an organic transistor according to one aspect of the present disclosure is a manufacturing method of an organic transistor that includes: (a) to form a gate electrode on one surface of a substrate; (b) to form a gate insulating film on one surface side of the substrate so as to cover the gate electrode; (c) to form a drain electrode and a source electrode with a predetermined distance therebetween on one surface side of the gate insulating film of the substrate and at a position where each electrode partially overlaps with the gate electrode; (d) to form a liquid crystal alignment film on one surface side of the gate insulating film of the substrate so as to cover the drain electrode and the source electrode; (e) to form an opening part by dripping an etchant to a region of the liquid crystal alignment film that overlaps with the gate electrode in a plane view; and (f) to form an organic semiconductor film at the opening part of the liquid crystal alignment film.

(2) A manufacturing method of a liquid crystal element according to one aspect of the present disclosure is a manufacturing method of a liquid crystal element that includes: (A) to bond the substrate manufactured by the manufacturing method in the above-described (1) and a counter substrate with a gap provided therebetween; and (B) to form a liquid crystal layer between the substrate and the counter substrate.

(3) An organic transistor according to one aspect of the present disclosure is an organic transistor manufactured by the manufacturing method according to the above-described (1).

(4) A liquid crystal element according to one aspect of the present disclosure is a liquid crystal element manufactured by the manufacturing method according to the above-described (2).

According to the above configurations, it is possible to obtain an organic transistor that achieves higher definition of a channel portion and to reduce bulging at the edge part of the channel portion, a method of manufacturing the organic transistor, and a liquid crystal element including the organic transistor.

DESCRIPTION OF THE PREFERRED EMBODIMENTS

Figure 1:
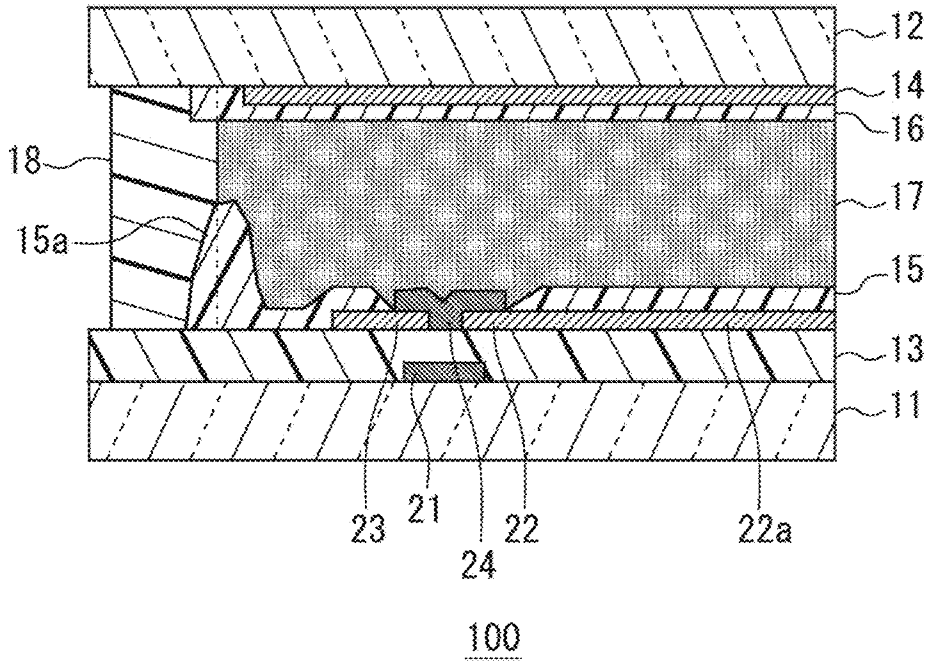
FIG. 1 is a schematic partial cross-sectional view showing the structure of a liquid crystal element of one embodiment.

FIG. 1 is a schematic partial cross-sectional view showing the structure of a liquid crystal element of one embodiment. As a general configuration, the liquid crystal element 100 of the present embodiment shown in FIG. 1 includes a first substrate 11 and a second substrate 12 disposed so that their surfaces face each other, a liquid crystal layer 17 disposed between the first substrate 11 and the second substrate 12, and a seal material 18 disposed so as to surround the liquid crystal layer 17.

The first substrate 11 and the second substrate 12 are each a transparent substrate such as a glass substrate or a plastic substrate, and are disposed with one side facing each other. Spacers (not shown) are disposed between the first substrate 11 and the second substrate 12. These spacers provide a gap of several μm between the surfaces of the first substrate 11 and the second substrate 12, for example.

The liquid crystal layer 17 is configured using a nematic liquid crystal material with fluidity, for example, and is disposed between each surface of the first substrate 11 and the second substrate 12. The thickness of the liquid crystal layer 17 is determined depending on the spacers described above, and is several μm, for example. As the liquid crystal material, either a material with a positive dielectric anisotropy or with a negative dielectric anisotropy may be used.

On one surface of the first substrate 11, there is provided a gate insulating film 13, an alignment film 15, a gate electrode 21, a drain electrode 22, a pixel electrode **22*a*, a source electrode 23, and an organic semiconductor film 24, etc. An organic transistor (thin film transistor) is configured to include the gate insulating film 13, the gate electrode 21, the drain electrode 22, and the organic semiconductor film 24. Further, the pixel electrode 22*a* is configured integrally with the drain electrode 22**.

The gate electrode 21 is provided on one surface of the first substrate 11. This gate electrode 21 is connected to a gate wiring 121 shown in FIG. 5A, etc. which will be described later. In this embodiment, the gate electrode 21 and the gate wiring 121 are integrally configured. The gate electrode 21 and the gate wiring 121 can be formed using a transparent conductive film such as ITO (indium tin oxide), or a conductive film such as a metal film.

The gate insulating film 13 is provided on one surface of the first substrate 11 so as to cover the gate electrode 21 and the gate wiring 121. The gate insulating film 13 can be configured using an organic insulating film or an inorganic insulating film such as SiN or $SiO_2$, for example.

The drain electrode 22 is provided on one surface of the gate insulating film 13 (the surface on the liquid crystal layer 17 side) on one surface side of the first substrate 11. This drain electrode 22 is connected to the pixel electrode **22*a* as described above. In this embodiment, the drain electrode 22 and the pixel electrode 22*a* are integrally configured. The drain electrode 22 and the pixel electrode 22*a*** can be formed using a transparent conductive film such as ITO (indium tin oxide) or a conductive film such as a metal film.

The source electrode 23 is provided on one surface of the gate insulating film 13 (the surface on the liquid crystal layer 17 side) on one surface side of the first substrate 11. This source electrode 23 is connected to a source wiring 123 shown in FIG. 5A, etc. which will be described later. In this embodiment, the source electrode 23 and the source wiring 123 are integrally configured. The source electrode 23 and the source wiring 123 can be formed using a transparent conductive film such as ITO (indium tin oxide) or a conductive film such as a metal film.

As shown in the figure, the drain electrode 22 and the source electrode 23 are each provided at a position which partially overlap with the gate electrode 21. Further, there is provided a gap between the drain electrode 22 and the source electrode 23. This gap corresponds to the length of the channel portion. The channel portion can have a channel length of 10 μm and a channel width of 50 μm, for example. The gate electrode 21 is disposed so as to overlap with the gap between the drain electrode 22 and the source electrode 23 in a plane view.

The organic semiconductor film 24 is provided so that at least a part thereof fills the gap between the drain electrode 22 and the source electrode 23. The organic semiconductor film 24 is provided in physical contact with a part of each of the drain electrode 22 and the source electrode 23 so as to be electrically conductive therebetween.

As the organic material for forming the organic semiconductor film 24, polyacenes having a highly expanded π skeleton such as pentacene and naphthacene are preferable, for example. Heteroaromatics such as s thiophene can also be incorporated to avoid instability. Thienoacene exhibits excellent stability and high carrier mobility. Among the organic semiconductors based on thienoacene, for example, compounds with an internal thieno [3,2-b]thiophene structure such as BTBT ([1]benzothieno [3,2-b][1] benzothiophene) and DNTT (dinaphtho [2,3-b: 2'3'-f] thieno [3,2-b] thiophene) have high mobility, atmospheric stability, and good reproducibility, and are excellent as P-type organic semiconductors for PFETs, and are available from Sigma-Aldrich Co., etc.

The alignment film 15 is provided on one surface side of the gate insulating film 13 so as to cover the drain electrode 22 and the source electrode 23, etc. As the alignment film 15, a horizontal alignment film, a vertical alignment film, etc. are used as appropriate. The alignment film 15 may be subjected to uniaxial alignment treatment such as rubbing. As illustrated, the alignment film 15 has an opening part in a region overlapping the gate electrode 21 in a plane view, and the organic semiconductor film 24 is disposed at this opening part.

Further, the alignment film 15 has a bulged part **15*a* at a position close to an end portion (the left end portion in the figure) of the first substrate 11 and the second substrate 12. This bulged part 15*a* is a part that is thicker than the other part of the alignment film 15. In this embodiment, the bulged part 15*a* is disposed to partially overlap the seal material 18**.

A common electrode (counter electrode) 14 and an alignment film 16 are provided on one surface of the second substrate 12.

The common electrode 14 is disposed on one surface of the second substrate 12 so as to face the pixel electrode **22*a*. The common electrode 14** can be formed using a transparent conductive film such as ITO (indium tin oxide) or a conductive film such as a metal film.

The alignment film 16 is provided on one surface side of the second substrate 12 so as to cover the common electrode 14. As the alignment film 16, a horizontal alignment film, a vertical alignment film, etc. are used as appropriate. Uniaxial alignment treatment such as rubbing may also be performed.

Figure 2:
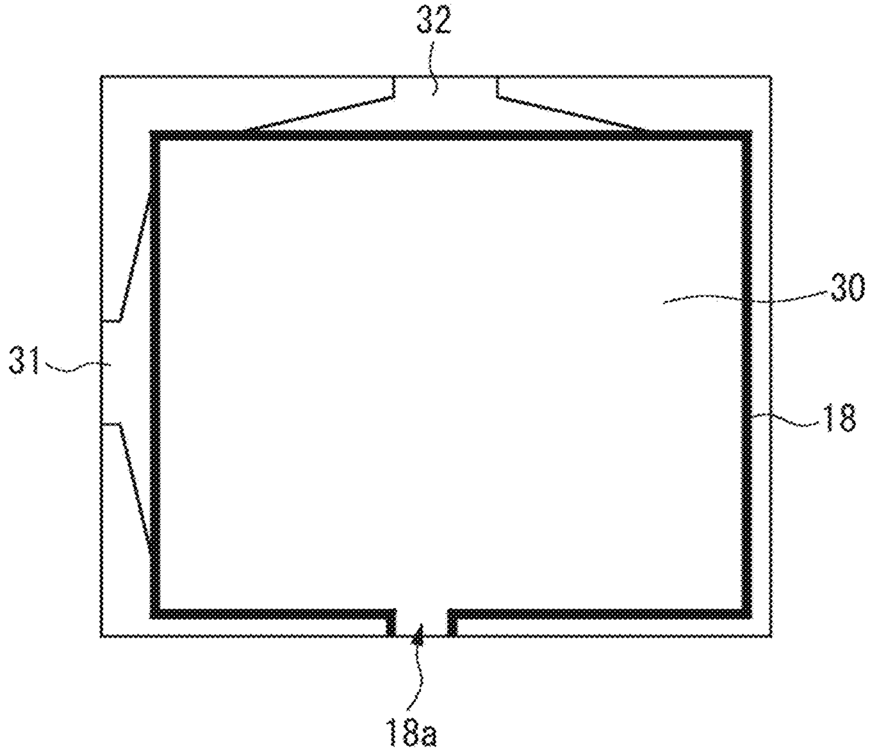
FIG. 2 is a schematic plane view for explaining the configuration of the liquid crystal element.

FIG. 2 is a schematic plane view for explaining the configuration of the liquid crystal element. The liquid crystal element 100 has a generally rectangular shape in a plane view. The seal material 18 for sealing the liquid crystal layer 17 is provided in a rectangular frame shape in a plane view, provided slightly inside along the outer edge of the liquid crystal element 100. The seal material 18 of this embodiment has an injection port **18*a* that is partially opened. This injection port 18*a* is used in the process of forming the liquid crystal layer 17, and is sealed with an end seal material (not shown). As illustrated, the inner portion surrounded by the seal material 18 is a display section 30 that contributes to image display. There is provide a gate extraction electrode part 31 connected to the above-described gate wiring 121 on the left side of the display section 30 in the figure, and there is provided a source extraction electrode part 32 connected to the source wiring 123** on the upper side in the figure.

FIGS. 3A to 3D and FIGS. 4A to 4C are schematic partial cross-sectional views for explaining a manufacturing method of an organic transistor and a manufacturing method of a liquid crystal element including the organic transistor. Further, FIG. 5A, FIG. 5B, FIG. 6A, FIG. 6B, FIG. 7A, and FIG. 7B are schematic partial plane views for explaining a manufacturing method of an organic transistor and a manufacturing method of a liquid crystal element including the organic transistor. Here, note that the cross-sectional views shown in FIGS. 3A to 3D and FIGS. 4A to 4C correspond to the cross-sectional view taken along the a-a line shown in FIG. 5A. Further, in each of the figures (FIGS. 5A to 7B), the dotted line 130 indicates a boundary line of the display section 30.

Figure 3A:
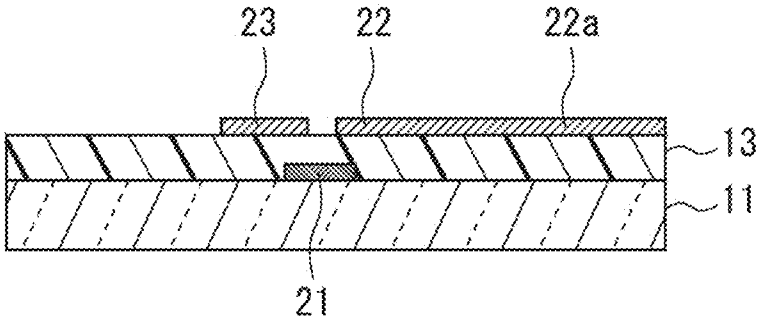
FIGS. 3A to 3D are schematic partial cross-sectional views for explaining a manufacturing method of an organic transistor and a manufacturing method of a liquid crystal element including the organic transistor.
Figure 5A:
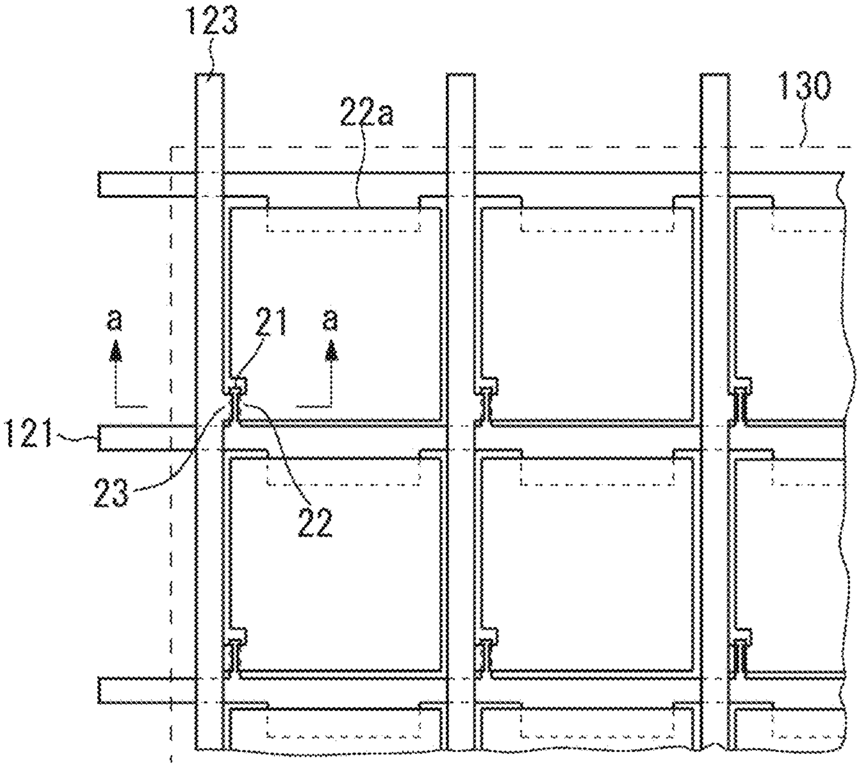
FIG. 5A and FIG. 5B are schematic partial plane views for explaining a manufacturing method of an organic transistor and a manufacturing method of a liquid crystal element including the organic transistor.

As shown in FIGS. 3A and 5A, each gate electrode 21 and each gate wiring 121 are formed on one surface of the first substrate 11, a gate insulating film 13 covering them is formed, and further, each drain electrode 22, each pixel electrode 22*a*, each source electrode 23, and each source wiring 123 are formed.

As shown in FIG. 5A, each gate wiring 121 is provided to extend in the left-right direction in the figure with an interval in between, and each source electrode 123 is provided to extend in the vertical direction in the figure with an interval in between. Each drain electrode 22 and each pixel electrode 22*a* are provided between each gate wiring 121 and between each source wiring 123, respectively, in a plane view.

Figure 3B:
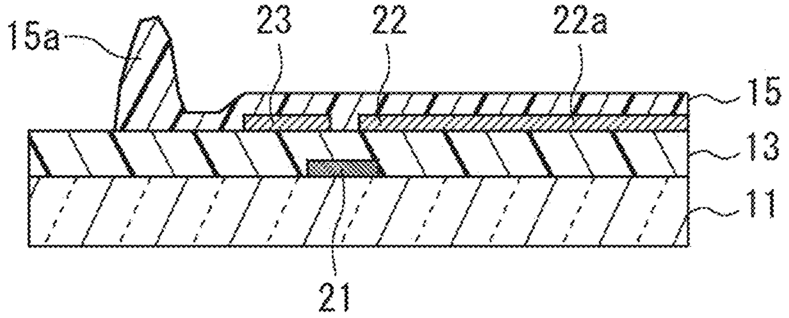
Figure 5B:
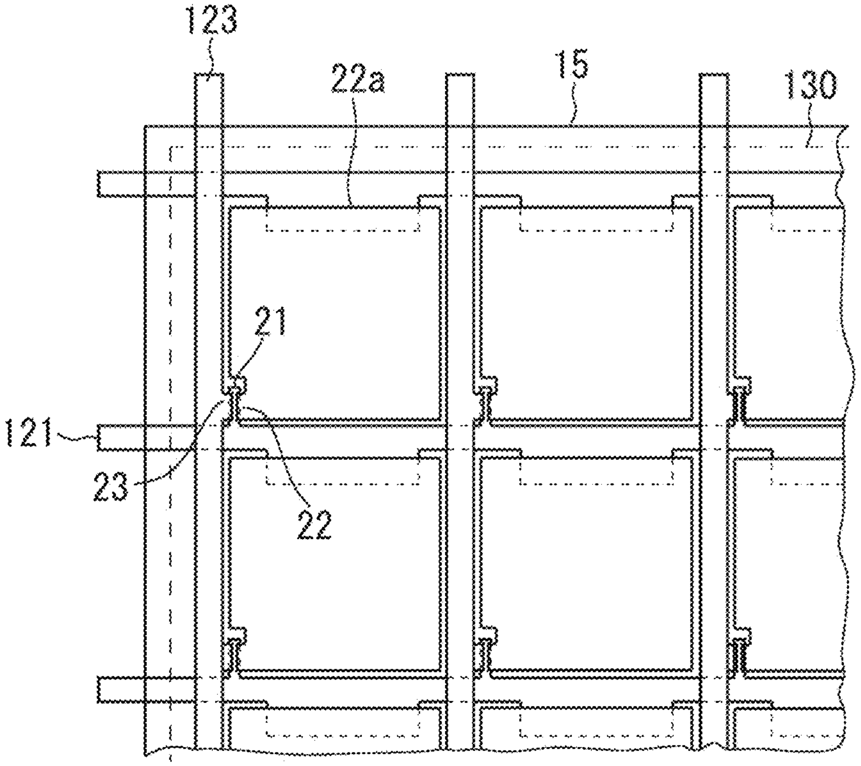

Next, as shown in FIGS. 3B and 5B, an alignment film 15 is formed on one surface side of the first substrate 11 so as to cover each drain electrode 22, each pixel electrode 22*a*, and each source electrode 23. A bulged part 15*a* develops on the alignment film 15 near the end portion of the first substrate 11. The alignment film 15 can be formed by, for example, flexographic printing, leveling, and then pre-baked at 90° C.

As shown in FIG. 5B, the alignment film 15 is formed to have a slightly larger size (for example, a size equal to or greater than 100 μm) than the boundary of the display section 30 indicated by the dotted line 130. Further, the alignment film 15 is formed so as not to overlap the gate extraction electrode part 31 and the source extraction electrode part 32. The alignment film 15 can be formed so as not to overlap the region where the seal material 18 is provided, or can be formed so as to partially overlap the seal material as shown in FIG. 4B.

Figure 3C:
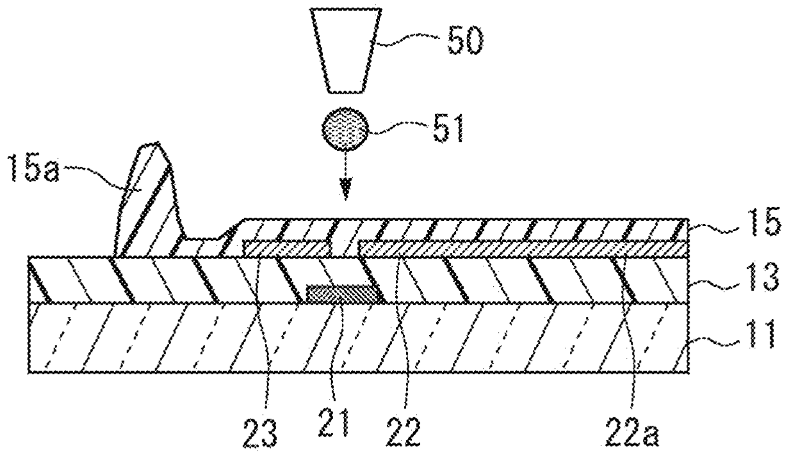
Figure 6A:
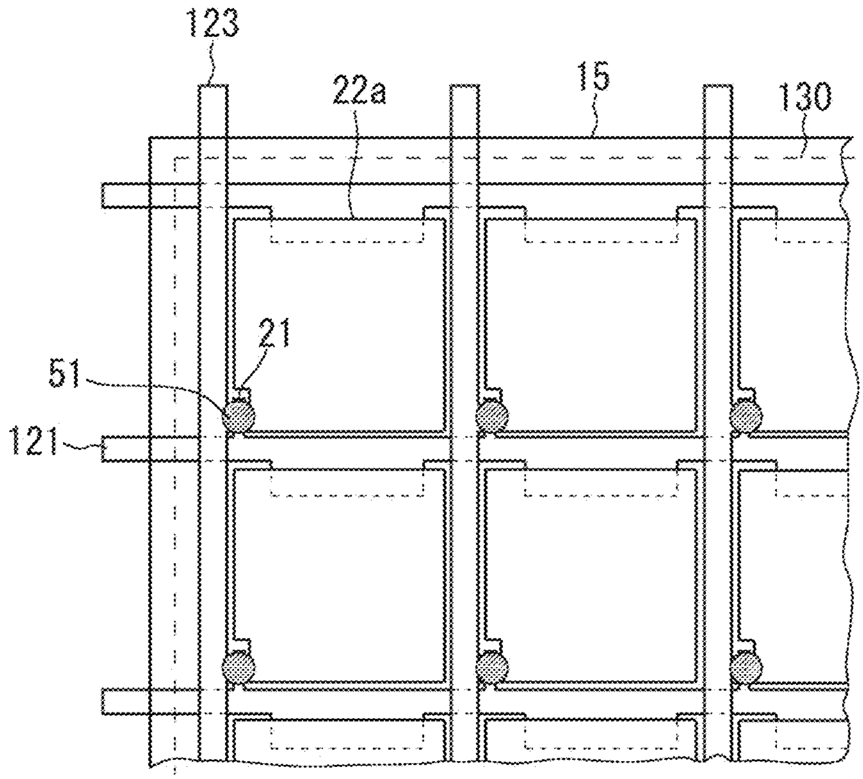
FIG. 6A and FIG. 6B are schematic partial plane views for explaining a manufacturing method of an organic transistor and a manufacturing method of a liquid crystal element including the organic transistor.

Next, as shown in FIG. 3C and FIG. 6A, etchant 51 is dripped using a dispenser 50 to each region between each drain electrode 22 and each source electrode 23 (each region which is to become a channel portion), for example. As etchant 51, NMP (N-methyl-2-pyrrolidone) can be used, for example. Here, note that etchant 51 is not limited to NMP, and other polar solvents, alkaline solutions (KOH, NaOH, etc.) and gelled solutions thereof can be used.

Figure 3D:
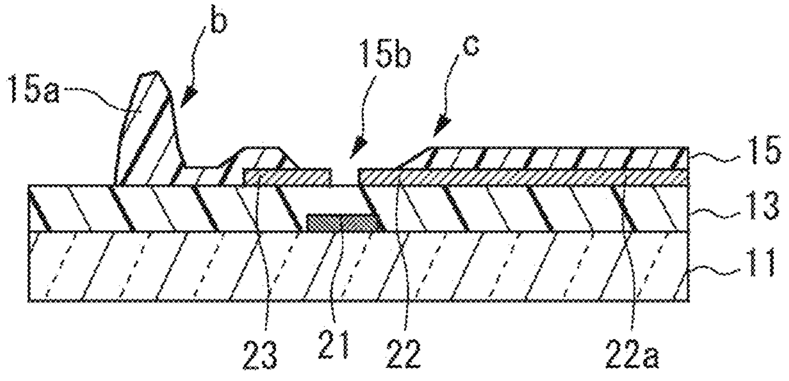
Figure 6B:
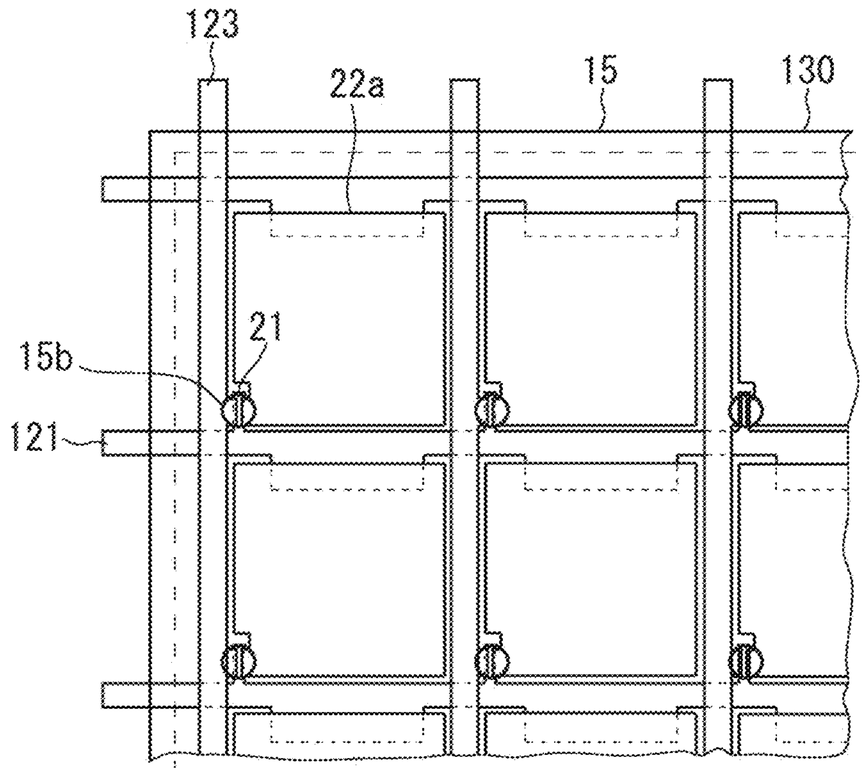

Since the alignment film 15 is partially dissolved by etchant 51, by cleaning the alignment film 15 using pure water or the like, as shown in FIG. 3D and FIG. 6B, each opening part (channel opening part) 15*b* is formed in the alignment film 15.

Here, since etchant 51 is dripped in a dotted manner, each opening part 15*b* has a substantially circular shape in a plane view as shown in the figure, but when the etchant 51 is dripped in a linear manner, each opening part 15*b* becomes an elliptical shape in a plane view.

Further, when the alignment film 15 is a vertical alignment film, the alignment film 15 becomes water repellent, so that the dripped etchant 51 becomes difficult to spread. Therefore, it becomes easier to control the diameter of each opening part 15*b*, and for example, it can be controlled to a size of about 50 μm to 200 μm. By forming each opening part 15*b*, each drain electrode 22 and each source electrode 23 are partially exposed.

According to such processes, each opening part 15*b* can be provided at low cost and with high precision without performing a photo-lithography process using a photomask or the like.

After forming each opening part 15*b* in the alignment film 15, main baking is performed to the alignment film 15. This main baking can be performed, for example, at 200° C. for 1.5 hours. Thereafter, the alignment film 15 is subjected to a uniaxial alignment process such as a rubbing process or a photo alignment process as appropriate. Here, note that main baking of the alignment film 15 may be performed before forming each opening part 15*b*. Further, cleaning may be performed with pure water or a lower alcohol such as isopropyl alcohol after performing an alignment treatment such as a rubbing process. As a result of this cleaning, fiber dust generated during the rubbing process can be removed, and the surface of the gate insulating film of the channel portion (opening part) of the organic transistor can be cleaned, thereby the performance of the organic transistor can be improved.

Figure 4A:
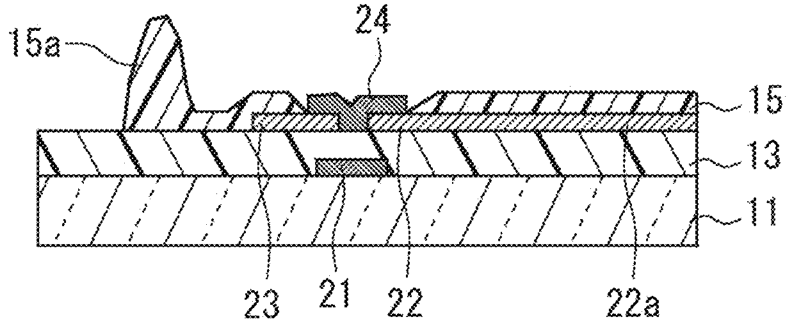
FIGS. 4A to 4C are schematic partial cross-sectional views for explaining a manufacturing method of an organic transistor and a manufacturing method of a liquid crystal element including the organic transistor.
Figure 4B:
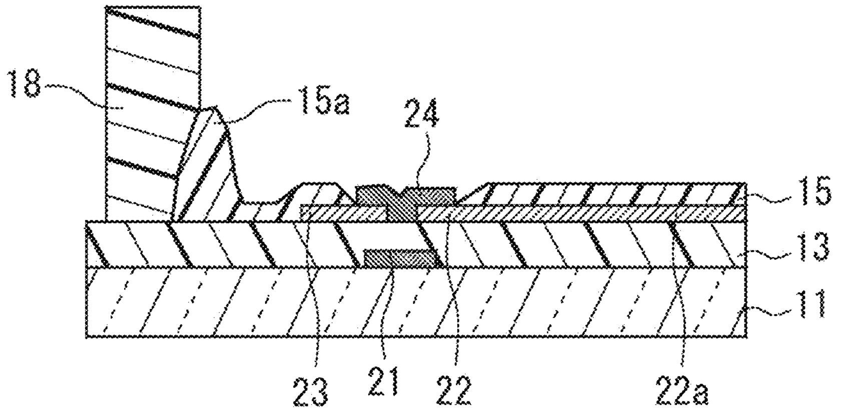
Figure 7A:
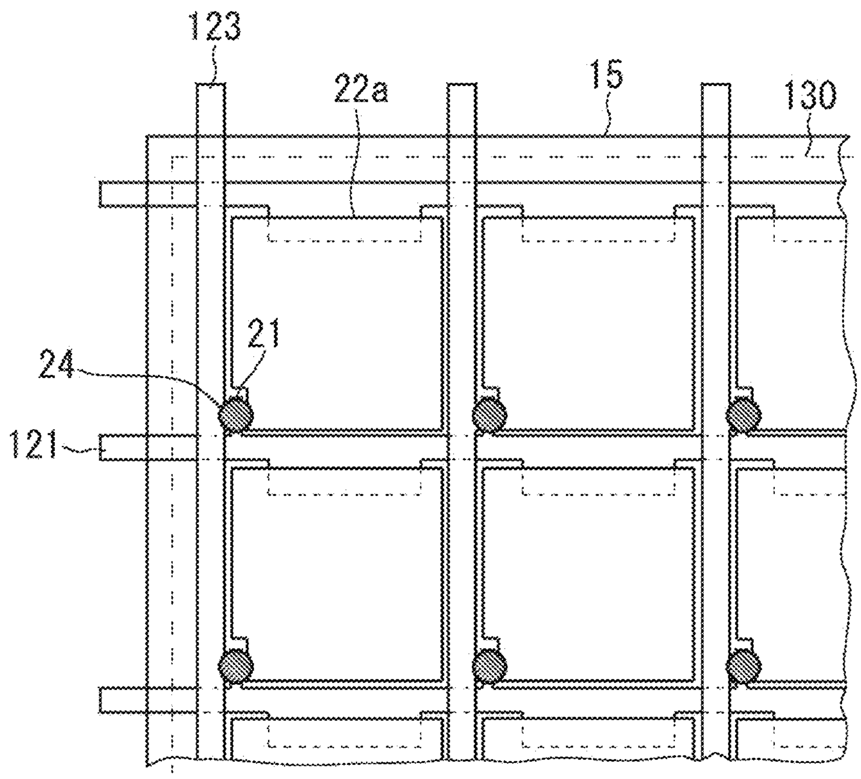
FIG. 7A and FIG. 7B are schematic partial plane views for explaining a manufacturing method of an organic transistor and a manufacturing method of a liquid crystal element including the organic transistor.

Next, as shown in FIGS. 4A and 7A, each organic semiconductor film 24 is formed by dripping an organic semiconductor material onto each opening part 15*b*. The organic semiconductor material can be dripped using inkjet method, for example. When a vertical alignment film is used, the alignment film 15 is water repellent, and since the dripped organic semiconductor material is repelled, each organic semiconductor film 24 having approximately the same size as each opening part 15*b* can be obtained. The thickness of the organic semiconductor film 24 can be formed to about 40 μm, which is about the same as that of the alignment film 15, for example. That is, it is preferable that the amount of the organic semiconductor material to be dripped is set such that the thickness of the organic semiconductor film 24 and the thickness of the alignment film 15 are approximately the same.

Here, note that an alignment treatment such as a rubbing process may be performed after forming each organic semiconductor film 24. However, in order to more surely prevent deterioration of each organic semiconductor film 24, it is more preferable that alignment treatment be performed before forming each organic semiconductor film 24.

Through the processes up to this point, a plurality of organic transistors are completed on the first substrate 11.

Figure 4C:
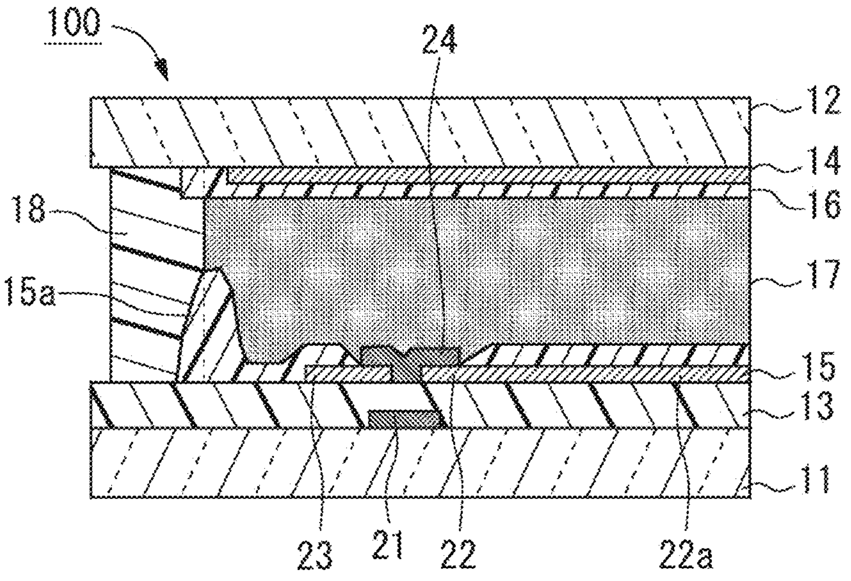
Figure 7B:
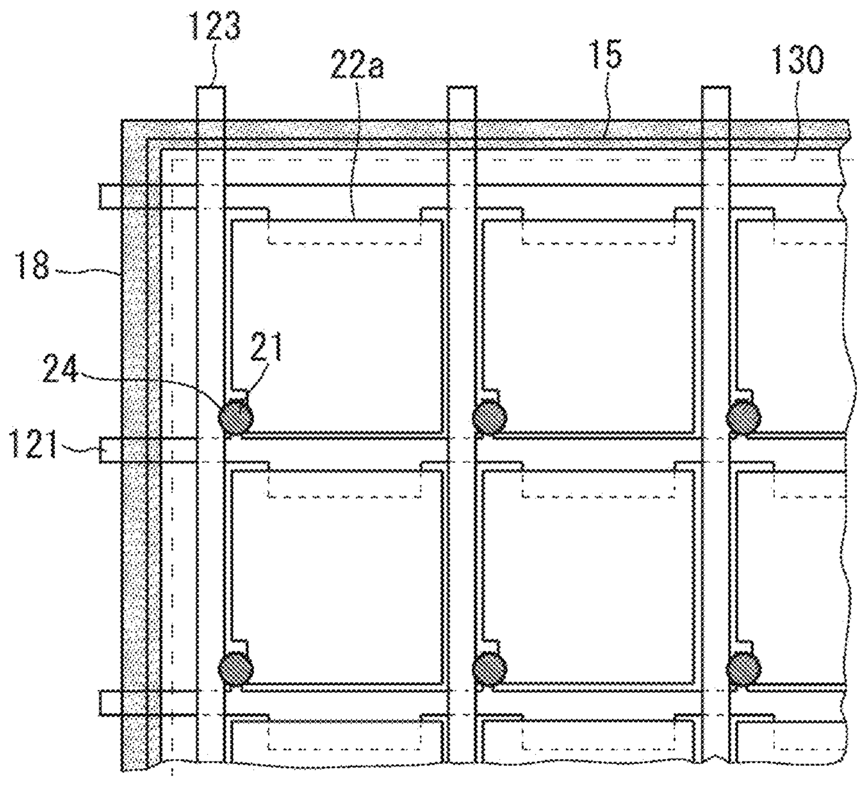

Next, as shown in FIGS. 4C and 7B, the seal material 18 is formed. The seal material 18 is formed outside the boundary line of the display section 30 indicated by the dotted line 130 in a plane view. Further, the seal material 18 is formed so that it is slightly outside the outer edge of the alignment film 15 in a plane view, or so that about half or less of the seal material 18 in the width direction overlaps the outer edge of the alignment film 15. (The latter in the illustrated example.)

On the other hand, a common electrode 14 is formed in advance on one surface side of the second substrate (counter substrate) 12, and an alignment film 16 is formed to cover the common electrode 14.

Next, spacing agent (not shown) is scattered on one surface of the first substrate 11 or one surface of the second substrate 12. The spacing agent may also be added to the seal material 18. Thereafter, as shown in FIG. 4C, the first substrate 11 and the second substrate 12 are overlapped, and the seal material 18 is baked. Baking can be performed at 150° C. for 2 hours, for example.

Thereafter, as shown in FIG. 4C, a liquid crystal layer 17 is formed by injecting a liquid crystal material into the gap between the first substrate 11 and the second substrate 12. In this embodiment, the liquid crystal layer 17 is formed by vacuum injection method using the injection port 18*a* described above.

Here, for example, it is preferable to use a liquid crystal material having a negative dielectric anisotropy and to which a higher alcohol (a material with a molecular structure of a long-term alkyl chain and an OH group at the end) is added (so-called self-alignment liquid crystal material), that is, a liquid crystal material that exhibits vertical alignment even without an alignment film. Since the present embodiment has a structure in which the alignment film 15 does not exist at the region of the organic semiconductor film 24, the use of such liquid crystal material ensures good alignment of the liquid crystal layer 17 in this region and improves display quality.

Through the above processes, a liquid crystal element 100 having a plurality of organic transistors is completed.

Figure 8:
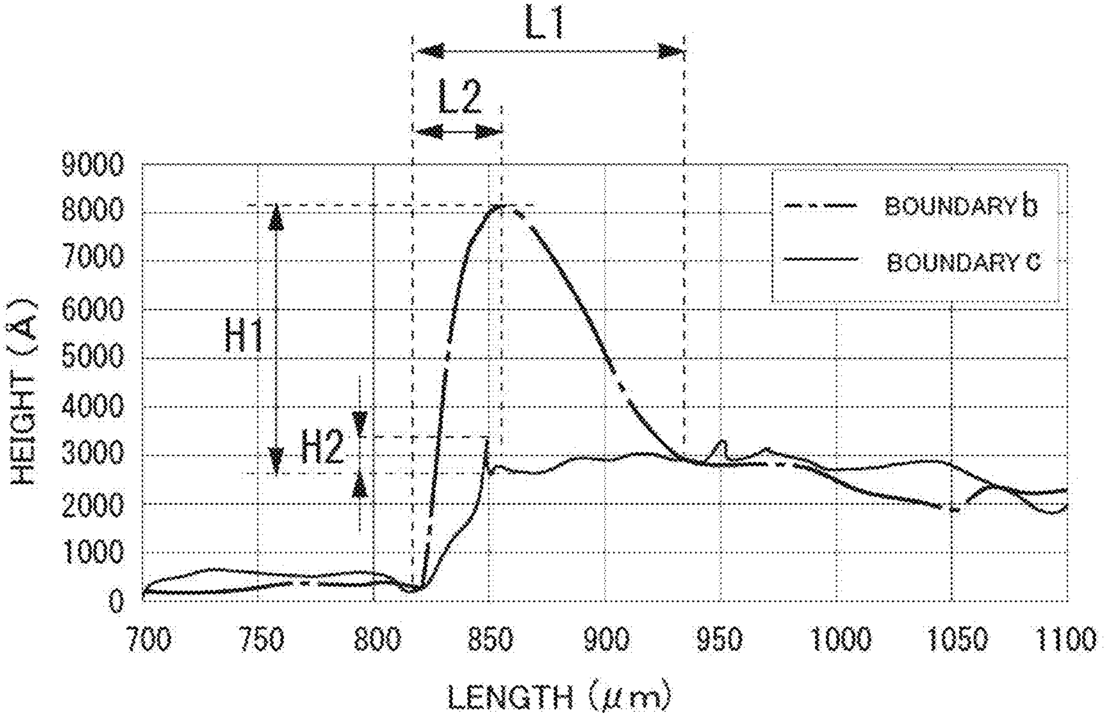
FIG. 8 is a diagram showing an example of measured results of the stepped shape of the opening part 15*b* and the stepped shape of the outer edge of the alignment film 15.

FIG. 8 is a diagram showing an example of the measured results of the stepped shape of the opening part 15*b* and the stepped shape of the outer edge of the alignment film 15. In FIG. 8, in order to facilitate comparison of each stepped shape, the steps are aligned at the rising points of these steps and displayed. Here, measurements were performed using a sample of a liquid crystal element manufactured in accordance with the above-described embodiment. Here, note that the stepped shape at the outer edge of the alignment film 15 is the shape near portion b shown in FIG. 3D, and hereinafter, this portion b will be referred to as "boundary b". Further, the stepped shape of the opening part 15*b* is the shape near the c portion shown in FIG. 3D, and hereinafter, this portion c will be referred to as "boundary c". As shown in the figure, it can be seen that height and width of each of the stepped shapes are significantly different. In the illustrated sample, the height (the bulge) H1 of boundary b is approximately 9 times greater than the height (the bulge) H2 of boundary c, and the length (width) L1 of boundary b is approximately 3.2 times greater than the length (width) L2 of boundary c.

The phenomenon in which a bulged part such as the bulged part 15*a* occurs at the outer edge of the alignment film 15 formed by flexographic printing is called a coffee-ring phenomenon. This bulged part is difficult to avoid when using flexographic printing or inkjet method, making it difficult to form a high-definition pattern on the alignment film 15, and also causes defective alignment of the liquid crystal layer 17 due to uneven height (i.e. uneven film thickness). Therefore, such a bulged part being generated inside the display section 30 is not preferable. On the other hand, the stepped shape of the opening part 15*b* is highly precise and has almost no bulged part, thereby, it is presumed that this part does not adversely affect the alignment of the liquid crystal layer 17.

The characteristics of the structure of the liquid crystal element 100 according to this embodiment are listed below.

(1) Each organic semiconductor film 24 and the liquid crystal layer 17 have a part in direct contact with each other. Since liquid crystal molecules are tightly packed in the liquid crystal layer 17 and moisture does not easily pass through, the liquid crystal layer 17 also functions as a passivation film for each organic semiconductor film 24.

(2) The surface of each organic semiconductor film 24 has not been subjected to an alignment treatment such as rubbing, and the surface of the alignment film 15 existing around each organic semiconductor film 24 has been subjected to an alignment treatment.

(3) The alignment film 15 is formed in a large pattern so as not to overlap much with the seal material 18, has minute opening parts 15*b*, and an organic semiconductor film 24 is formed on one part or all of these opening parts 15*b*.

(4) The edge shape of the outer edge portion of the alignment film 15 and the edge shape of the outer edge portion of each opening part 15*b* are different. The bulge of the outer edge portion of the alignment film 15 is at least twice as high (for example, about 9 times) as that of the outer edge portion of each opening part 15*b*, and the width (boundary width) of the outer edge portion of the alignment film 15 is at least twice as wide (for example, 3.2 times) as that of the outer edge portion of each opening part 15*b*.

(5) The alignment film 15 is a vertical alignment film, and the liquid crystal material comprising the liquid crystal layer 17 is a liquid crystal with a negative dielectric anisotropy, and contains higher alcohol (a material with a molecular structure of a long-term alkyl chain and an OH group at the end), and also exhibits uniform vertical alignment in the region of the organic semiconductor film 24.

According to the embodiment as described above, it is possible to achieve higher definition of a channel portion of an organic transistor and to reduce bulging at the edge part of the channel portion.

Here, note that the present disclosure is not limited to the content of the embodiment described above, and can be implemented with various modifications within the scope of the gist of the present disclosure. For example, a self-assembled monolayer film (SAM film) may be provided on the surfaces of the drain electrode 22 and the source electrode 23 in the above-described embodiment. A manufacturing method according to this modified example will be described with reference to FIGS. 9A to 9D. Here, note that the processes other than those related to the SAM film are the same as those in the above-described embodiment, so the description of the common processes will be omitted.

Figure 9A:
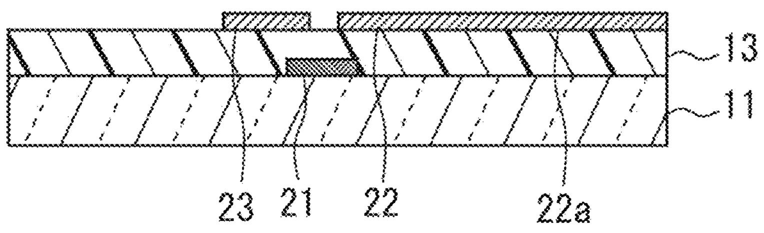
FIGS. 9A to 9D are schematic partial cross-sectional views for explaining a manufacturing method according to a modified example.
Figure 9B:
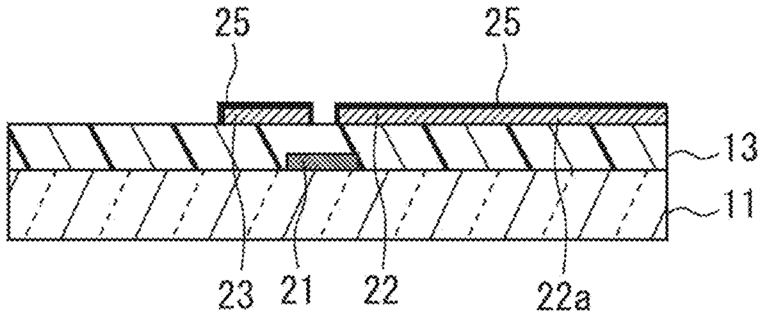

Similarly to the embodiment described above, as shown in FIG. 9A, a drain electrode 22 and a source electrode 23 are formed on one surface side of the gate insulating film 13 of the first substrate 11. Next, as shown in FIG. 9B, a SAM film 25 is formed on the drain electrode 22 and the source electrode 23 using SAM agent. As the SAM agent, for example, $2PAC_2$, MeO-$2PAC_2$, PFBPA, pCF3-PhPA, and NPPA can be used.

Figure 9C:
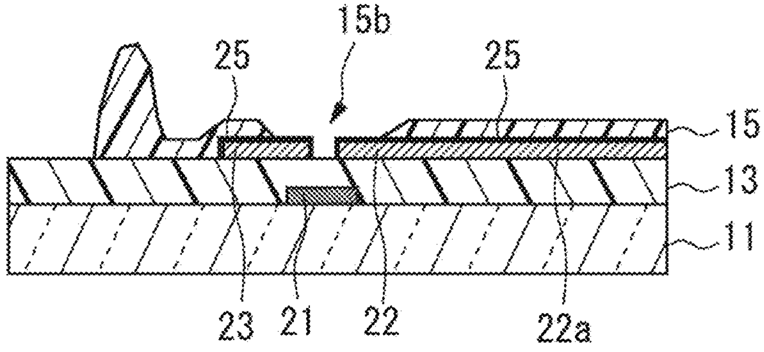
Figure 9D:
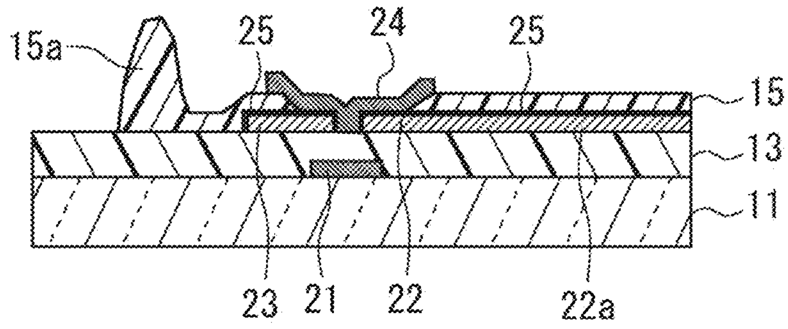

Thereafter, similarly to the above-described embodiment, as shown in FIG. 9C, an alignment film 15 is formed so as to cover the drain electrode 22 and source electrode 23 on which the SAM film 25 is provided, and the opening part 15*b* is formed. Then, as shown in FIG. 9D, an organic semiconductor film 24 is formed at the opening part 15*b*.

The organic transistor and the liquid crystal element according to the manufacturing method of this modified example have a structure in which the SAM film 25 is provided under the alignment film 15 in the portion excluding the opening part 15*b* as shown in the figure. By providing such SAM film 25, it is possible to improve the mobility of the organic transistor.

The present application is based on, and claims priority from, JP Application Serial Number 2023-083278 filed on May 19, 2023, the disclosure of which is hereby incorporated by reference herein in its entirety.

DESCRIPTION OF SYMBOLS

11: First substrate
12: Second substrate
13: Gate insulating film
14: Common electrode
15, 16: Alignment film
15*a*: Bulged part
15*b*: Opening part
17: Liquid crystal layer
18: Seal material
21: Gate electrode
22: Drain electrode
22*a*: Pixel electrode
23: Source electrode
24: Organic semiconductor film
25: SAM film
100: Liquid crystal element

What is claimed is:

1. A manufacturing method of an organic transistor that comprises:

(a) forming a gate electrode on one surface of a substrate;

(b) forming a gate insulating film on one surface side of the substrate so as to cover the gate electrode;

(c) forming a drain electrode and a source electrode with a predetermined distance therebetween on one surface side of the gate insulating film of the substrate and at a position where each electrode partially overlaps with the gate electrode;

(d) forming a liquid crystal alignment film on one surface side of the gate insulating film of the substrate so as to cover the drain electrode and the source electrode;

(e) forming an opening part by dripping an etchant to a region of the liquid crystal alignment film that overlaps with the gate electrode in plan view; and (f) forming an organic semiconductor film at the opening part of the liquid crystal alignment film.

2. The manufacturing method of an organic transistor according to claim 1, wherein, in the step (e), the opening part is formed in a circular shape or an elliptical shape in plan view.

3. The manufacturing method of an organic transistor according to claim 1, wherein, in the step (f), the organic semiconductor film is formed by dripping an organic semiconductor material to the opening part.

4. The manufacturing method of an organic transistor according to claim 1, wherein the liquid crystal alignment film in the step (d) is a vertical alignment film.

5. The manufacturing method of an organic transistor according to claim 1, wherein, in the step (f), an amount of the organic semiconductor material being dripped is determined so that a height of the organic semiconductor film and that of the liquid crystal alignment film becomes the same.

6. The manufacturing method of an organic transistor according to claim 1, wherein, the step (d) includes performing uniaxial alignment treatment on the liquid crystal alignment film.

7. The manufacturing method of an organic transistor according to claim 1, wherein, between the step (c) and the step (d), a self-assembled monolayer film is formed on each side of the drain electrode and the source electrode.

8. A manufacturing method of a liquid crystal element that comprises:

(A) bonding the substrate manufactured by the manufacturing method according to claim 1 and a counter substrate with a gap provided therebetween; and (B) forming a liquid crystal layer between the substrate and the counter substrate.

9. The manufacturing method of a liquid crystal element according to claim 8, wherein, the step (B) includes forming the liquid crystal layer using a liquid crystal material with a negative dielectric anisotropy.

10. The manufacturing method of a liquid crystal element according to claim 8, wherein, in the step (B), a liquid crystal material having a negative dielectric anisotropy and to which a higher alcohol is added is used to form the liquid crystal layer.

11. An organic transistor manufactured by the manufacturing method of an organic transistor according to claim 1.

12. A liquid crystal element manufactured by the manufacturing method of a liquid crystal element according to claim 8.

* * * * *